(12) United States Patent
Lee et al.

(10) Patent No.: US 7,435,681 B2
(45) Date of Patent: Oct. 14, 2008

(54) METHODS OF ETCHING STACKS HAVING METAL LAYERS AND HARD MASK LAYERS

(75) Inventors: Hong-Ji Lee, Taoyuan County (TW); Chun-Hung Lee, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 120 days.

(21) Appl. No.: 11/382,401

(22) Filed: May 9, 2006

(65) Prior Publication Data
US 2007/0264773 A1    Nov. 15, 2007

(51) Int. Cl.
  *H01L 21/461* (2006.01)
  *H01L 21/302* (2006.01)
  *H01L 21/44*  (2006.01)

(52) U.S. Cl. .............. 438/689; 438/669; 438/706; 438/720; 257/E21.219; 257/E21.218

(58) Field of Classification Search ............. 438/597, 438/720, 742, 761, 758, 778; 257/E21.314, 257/E21.31, E21.218, E21.219
See application file for complete search history.

(56) References Cited

U.S. PATENT DOCUMENTS

| | | | |
|---|---|---|---|
| 4,830,978 A  * | 5/1989  | Teng et al. ............... 438/249 |
| 5,376,234 A  * | 12/1994 | Yanagida ................. 438/695 |
| 5,843,848 A    | 12/1998 | Yanagawa |
| 6,159,863 A  * | 12/2000 | Chen et al. .............. 438/720 |
| 6,242,107 B1   | 6/2001  | O'Donnell |
| 6,337,244 B1 * | 1/2002  | Prall et al. ............... 438/257 |
| 6,846,424 B2 * | 1/2005  | Baum et al. .............. 216/13 |
| 6,852,592 B2 * | 2/2005  | Lee et al. ................ 438/253 |
| 6,964,928 B2   | 11/2005 | Ying et al. |
| 7,208,424 B2 * | 4/2007  | Stephens et al. .......... 438/720 |
| 2005/0048788 A1 | 3/2005 | Tang et al. |

* cited by examiner

Primary Examiner—Scott B. Geyer
Assistant Examiner—Mohsen Ahmadi
(74) Attorney, Agent, or Firm—Jianq Chyun IP Office

(57) ABSTRACT

Methods which comprise: providing a stack to be etched, the stack comprising a metal interconnect layer disposed above a substrate, a barrier layer disposed above the metal interconnect layer, a hard mask layer disposed on the barrier layer, and a patterning layer disposed above the hard mask layer wherein the patterning layer defines a pattern above the hard mask layer; and etching the pattern through the hard mask layer and at least a portion of the barrier layer, wherein the etching through an interface between the hard mask layer and the barrier layer is carried out using a fluorine-containing etch recipe.

20 Claims, 5 Drawing Sheets

METHODS OF ETCHING STACKS HAVING METAL LAYERS AND HARD MASK LAYERS

BACKGROUND OF THE INVENTION

Semiconductor processing often involves the formation of metallic interconnect lines, which are typically etched from a metal containing layer disposed above a substrate, and which are then employed to couple various devices on the substrate together to form a desired circuit. Metallic interconnect lines are often formed from a metal layer deposited on a semiconductor substrate as part of a larger stack of materials which may include barrier layers and/or anti-reflective coatings.

When a relatively tall stack of metal is to be etched for the purpose of defining a metal interconnect pattern or the like, it is sometimes desirable to use an oxide-based hard mask in place of, or in addition to an organic photoresist layer for controlling the etch-base patterning of the metal stack. The hard mask is typically used when it is possible that the photoresist layer may not be sufficiently strong enough alone to withstand the erosive environment of a harsh and/or long metal etching process.

When a hard mask layer is used for propagating an etch pattern from a photoresist pattern to an underlying metal layer, the organic photoresist layer is often first provided above the still blank (i.e., unpatterned) hard mask layer. The organic photoresist layer is then exposed to appropriate radiation and the exposed photoresist layer is then developed to leave behind the polymerized organic photoresist material over the blank hard mask layer. An oxide etching process is then typically used to pattern through the relatively thin hard mask layer using the pre-patterned photoresist layer as a pattern-proliferating mask. These steps are carried out before metal etching through the underlying metal layer is undertaken. In other words, the lithographic pattern that is provided by the photoresist layer is copied into the more durable hard mask layer and the hard mask layer pattern is then used to etch the pattern into the underlying metal interconnect layer. A variety of different materials have been proposed as hard mask layers, including various oxides.

Unfortunately, it is often the case that a significant amount of micromasking residue can be left behind on an underlying barrier layer, such as titanium-containing anti-reflective coatings, and that this micromasking residue may interfere with proper etching of the underlying metal layer. More specifically, the micromasking residue may create undesirable short circuits between metal interconnect lines in the semiconductor device.

Various proposals have been made for alleviating the problem of micromasking residues. For example, various washing methods have been proposed to be carried out between the etching of the hard mask material and the etching of the underlying barrier layer and/or metal interconnect layer. Additionally, the deposition of additional oxygen-deficient layers between hard mask materials and barrier layer materials has also been proposed. However, the reduction of micromasking residue is not always sufficient and the addition of washing steps and/or steps to remove the residue can decrease efficiency and/or increase the cost of the semiconductor processing.

Therefore, there is a need in the art for an improved method of etching metal stacks such that the amount of micromasking residue is reduced.

BRIEF SUMMARY OF THE INVENTION

The present invention relates generally to methods of etching metal layer-containing stacks, and more particularly, to methods of etching metal layer-containing stacks wherein a hard mask layer is employed as a pattern for metal etching. Methods according to the present invention are able to provide hard mask layer patterns with reduced amounts of masking residue at the hard mask layer/barrier layer interface. Additionally, methods according to the present invention do not require additional oxygen-deficient layers to avoid/minimize the formation of such residues, nor do they require additional washing steps to remove such residues. The minimization of such masking residues reduces the occurrence of undesirable short circuit defects between metal interconnect lines in resulting devices, and is a significant improvement over prior art methods of etching.

One embodiment of the present invention includes methods which comprise: providing a stack to be etched, the stack comprising a metal interconnect layer disposed above a substrate, a barrier layer disposed above the metal interconnect layer, a hard mask layer disposed on the barrier layer, and a patterning layer disposed above the hard mask layer wherein the patterning layer defines a pattern above the hard mask layer; and etching the pattern through the hard mask layer and at least a portion of the barrier layer, wherein the etching through an interface between the hard mask layer and the barrier layer is carried out using a fluorine-containing etch recipe.

In certain preferred embodiments of the present invention, the barrier layer can comprise titanium and/or titanium nitride. In certain preferred embodiments, the hard mask layer can comprise an oxide. In certain preferred embodiments, the fluorine-containing etch recipe includes at least one component selected from $CF_4$ and $CHF_3$.

Another embodiment of the present invention includes methods which comprise: providing a stack to be etched, the stack comprising a metal interconnect layer disposed above a semiconductor substrate, a titanium-containing barrier layer disposed above the metal interconnect layer, an oxide hard mask layer disposed on the barrier layer, and a photoresist patterning layer disposed above the hard mask layer wherein the patterning layer defines a pattern above the hard mask layer; and etching the pattern through the hard mask layer and at least a portion of the barrier layer, wherein the etching through an interface between the hard mask layer and the barrier layer is carried out using a fluorine-containing etch recipe.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
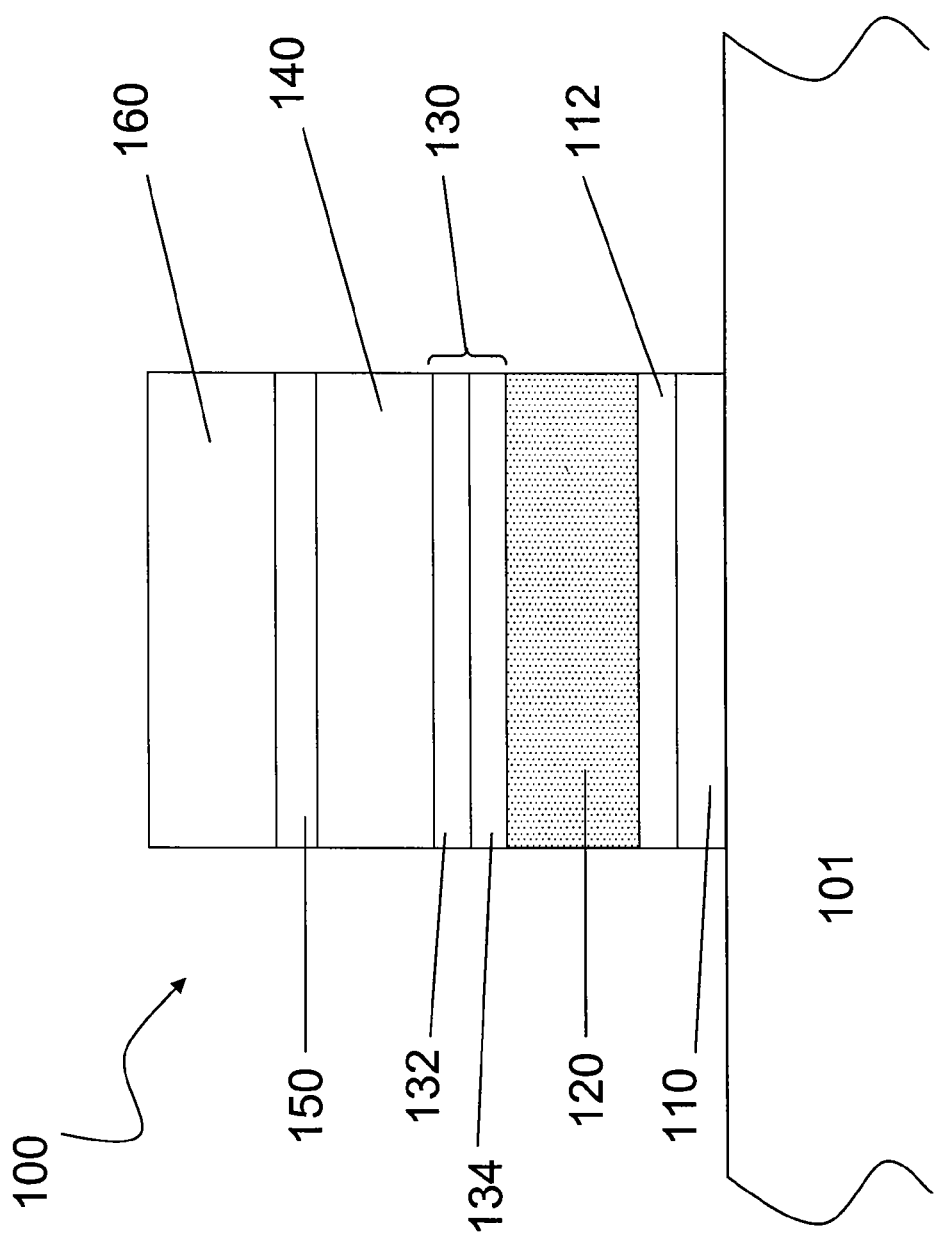
FIG. 1 is a cross-sectional schematic representation of a stack to be etched in accordance with one embodiment of the present invention.

Reference will now be made in detail to the invention and the presently preferred embodiments thereof, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as top, bottom, left, right, up, down, above, below, beneath, rear, and front, may be used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire semiconductor devices. The present invention may be practiced in conjunction with various semiconductor device fabrication techniques that can be used in the art either known or to be developed.

FIG. 1 illustrates one example of a stack which can be etched by methods according to the present invention. Referring to FIG. 1, a stack 100 is provided comprising a metal interconnect layer 120 and a barrier layer 130. The barrier layer may optionally comprise multiple layers. In the embodiment shown in FIG. 1, the barrier layer 130 includes an antireflective coating 132, preferably containing titanium nitride, and a metal layer 134, which can comprise titanium. A hard mask layer 140 is disposed on the upper surface of the barrier layer 130. A patterning layer 160 is disposed above the hard mask layer 140. Additional optional layers may be included between the hard mask layer and the patterning layer. For example, in the embodiment depicted in FIG. 1, an additional antireflective coating 150 can be included below the patterning layer 160. A stack may also include additional layers between the metal interconnect layer and the substrate 101, such as an insulating oxide layer 110 and/or a bottom barrier layer 112.

The present invention includes methods of etching stacks which contain various layers of material. As used herein, a "stack" refers to a series of layers of material on a substrate. The substrate may be any material on which multiple layers are deposited. In certain embodiments of the present invention, the substrate comprises a semiconductor material, such as, for example, silicon or germanium, either of which may be doped or undoped. In certain embodiments, the substrate comprises a semiconductor material having one or more devices such as memories, arrays or other circuit components formed thereon and situated below the stack. In this regard, it is to be understood that reference to the metal interconnect layer being disposed above the substrate refers to the potential inclusion of one or more additional layers between the substrate and the metal interconnect layer. For example, the substrate may contain a memory array formed thereon and may be separated from the metal containing stack above by one or more insulating layers, or insulating layer(s) and other barrier layers, such as, for example, as shown in FIG. 1.

The stacks to be etched in accordance with the methods of the present invention comprise a metal interconnect layer. The metal interconnect layer is generally a blank, unpatterned layer of metallic material disposed above the substrate material and any intervening layers (insulating or otherwise). The metal interconnect layer can comprise any conductive material, though preferably a pure metal or an alloy. In certain embodiments, the stack comprises a metal interconnect layer which comprises aluminum or an aluminum-containing alloy, such as, for example, AlCu. Other preferred metals include tungsten Metal interconnect layers can be deposited by any suitable method such as, for example, chemical vapor deposition or sputtering.

The stacks to be etched in accordance with the methods of the present invention also comprise a barrier layer which may include metals and metal-containing materials such as titanium, titanium nitride, tantalum, and tantalum nitride, etc. The barrier layer may comprise more than one layer of material. For example, as shown in FIG. 1, a barrier layer 130 can comprise a lower layer 134 and an upper layer 132. Certain embodiments of the present invention include etching of stacks wherein the barrier layer comprises two or more layers where one of the layers is an antireflective coating. In certain preferred embodiments, a multi-layer barrier layer can comprise a top antireflective coating layer. A top antireflective coating layer in accordance with such embodiments can preferably comprise titanium, and preferably titanium nitride (TiN). In some preferred embodiments of the present invention, the barrier layer comprises a top TiN antireflective coating layer and a bottom titanium metal layer. Barrier layer materials can be deposited to form stacks using any suitable method known in the art or to be developed.

The stacks to be etched in accordance with the methods of the present invention also comprise a hard mask layer. The hard mask layer can comprise an oxide material. In one embodiment of the present invention, a stack to be etched comprises a hard mask layer which can be formed by vapor deposition techniques employing chemistries including a silicon-source gas, e.g., $SiH_4$, $SiH_2Cl_2$, $SiHCl_3$, or TEOS (tetraethylorthosilicate) and an oxygen-source gas, e.g., $O_2$, $N_2O$ or $O_3$. In some embodiments of the present invention, a stack to be etched comprises a hard mask layer comprised of TEOS and preferably formed by PE-CVD ("plasma-enhanced CVD"), referred to as PE-TEOS. In several embodiments, the barrier layer comprises titanium and the hard mask layer comprises an oxide. In some embodiments, the barrier layer comprises TiN and the hard mask layer comprises an oxide.

In stacks to be etched according to the present invention, the hard mask layer is disposed on the barrier layer. The interface between the barrier layer and the hard mask layer is referred to herein, interchangeably, as the hard mask layer/barrier layer interface, the barrier layer/hard mask layer interface, the hard mask/barrier interface, the barrier/hard mask interface, and the interface between the two layers. In each instance, the terms refer to the physical interface between the bottom of the hard mask layer and the top of the barrier layer.

The stacks to be etched in accordance with the methods of the present invention also comprise a patterning layer which is disposed above the hard mask layer. The patterning layer can comprise a photoresist material. Additional layers, such as, for example, an antireflective coating, may be included between the patterning layer and the hard mask layer. Suitable photoresist materials may be either positive or negative image and are known in the art and may also be developed in the future. Lithographic methods for forming a pattern in a photoresist material are also known. A pattern can be formed in a photoresist material and can serve as a pattern-propagating mask above the hard mask layer. In accordance with the methods of the present invention, a pattern is formed in the patterning layer, and the pattern is then etched through the layers situated below the pattern formed in the patterning layer.

Figure 2:
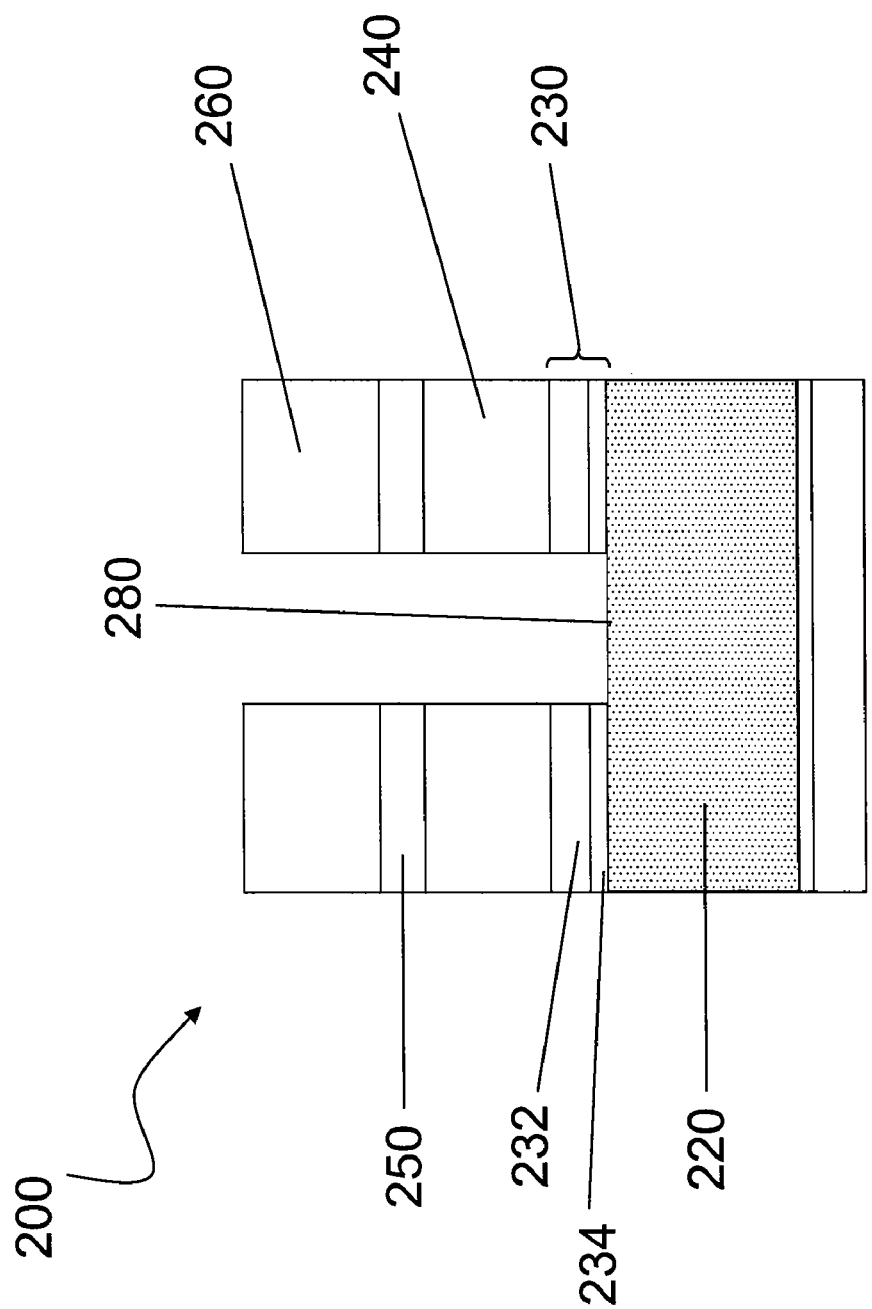
FIG. 2 is a cross-sectional schematic representation of a stack etched in accordance with one embodiment of the present invention.

Thus, for example, referring to FIG. 2, in certain embodiments according to the present invention, in a stack 200, a pattern can first be formed in a photoresist material 260 which serves as the patterning layer. An optional, underlying antireflective coating 250 and the hard mask layer 240 are then etched using the pattern in the photoresist material 260 as a mask. In accordance with certain embodiments of the present invention, the etching of the hard mask layer is continued through the entire barrier layer 230 comprised of a top antireflective coating layer 232 and a bottom metal barrier layer 234, stopping on the upper surface of the metal interconnect layer 220. As shown in FIG. 2, the pattern originally lithographed onto the photoresist material 260 is propagated through the hard mask layer 240 and barrier layer 230 to form the metal etching pattern 280.

Subsequent to the etch-through of the hard mask/barrier interface, the metal interconnect layer can then be etched using the pattern formed above in the hard mask layer. Additionally, any remaining photoresist material or other patterning layer material which is not removed during the hard mask layer etching, may be removed by any suitable means known or to be developed, before, during or after the metal etching.

Figure 3:
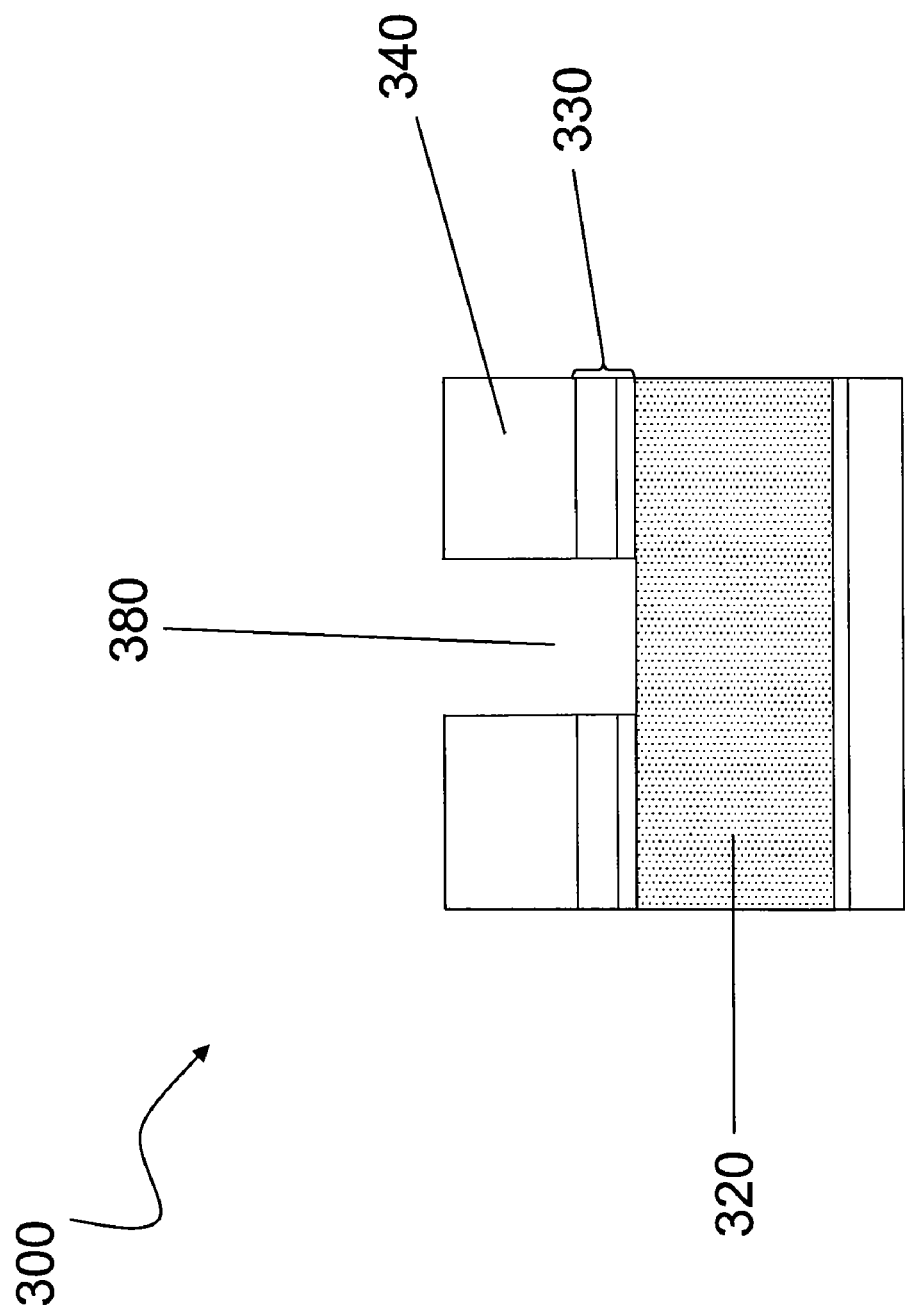
FIG. 3 is a cross-sectional schematic representation of a stack etched in accordance with one embodiment of the present invention.

FIG. 3 shows a stack 300, prior to etching the metal interconnect layer, after the patterning layer material has been removed. Accordingly, the uppermost layer of the stack remaining is the hard mask layer 340. The pattern 380 formed in the hard mask layer 340 and barrier layer 330 can be used to etch the same pattern in the metal interconnect layer 320.

Figure 4:
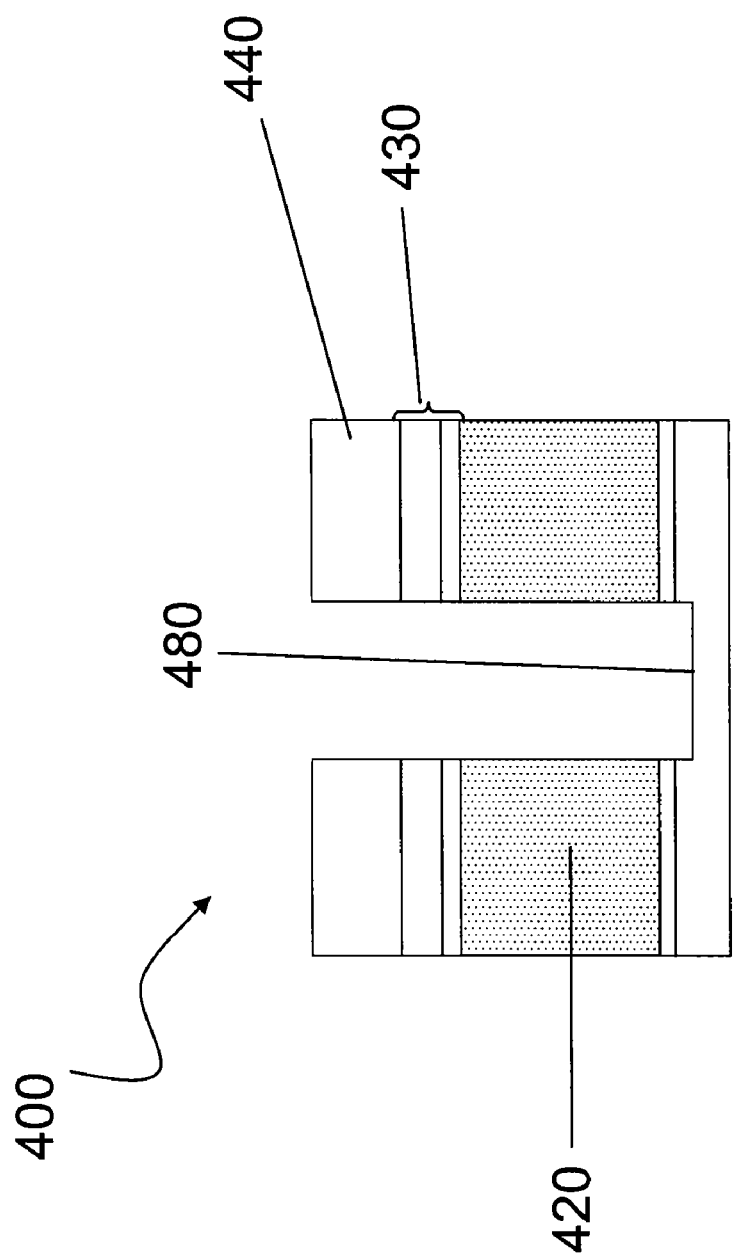
FIG. 4 is a cross-sectional schematic representation of a stack etched in accordance with one embodiment of the present invention.

FIG. 4 illustrates a stack 400 in which the metal interconnect layer 420 has been etched through by extending the pattern 480 originally formed above the metal interconnect layer in the hard mask layer 440 and the barrier layer 430. As shown in FIG. 4, additional etching of the metal interconnect layer 420 can cause further erosion of other stack materials such that the hard mask layer 440 is the uppermost remaining layer.

Etching of the hard mask layer and at least a portion of the barrier layer in accordance with the present invention is carried out using a fluorine-containing etch recipe. Subsequently, a metal interconnect line pattern can be defined in the metal interconnect layer via any suitable metal etching technique based on the pattern formed in the hard mask layer above.

Etching of the hard mask/barrier layer in accordance with the present invention can be carried out using any suitable plasma etching apparatus.

The chamber pressure during etch through of the hard mask layer/barrier layer interface in accordance with the present invention is generally about 75 to about 200 milliTorr (mT). Preferably, the chamber pressure at this stage is maintained at about 100 to about 180 mT, and more preferably at a pressure of about 120 to about 160 mT. In one particularly preferred embodiment of the present invention the etch through of the hard mask layer/barrier layer interface is carried out at a chamber pressure of about 150 mT.

Source power for the etching apparatus during etch through of the hard mask/barrier interface can vary depending upon the equipment. For example, using etching equipment operating at 13.56 MHz, the source power can be about 800 to about 1500 watts (W). Preferably, etching equipment operating at 13.56 MHz will have a source power of about 800 to about 1300 W, and more preferably, a source power of about 900 to about 1100 W. In one particularly preferred embodiment of the present invention, the source power for an etching apparatus operating at 13.56 MHz, during the etch through of the hard mask/barrier interface is about 1100 W.

The fluorine-containing etch recipe in accordance with the present invention for etching through the hard mask layer and at least a portion of the barrier layer comprises at least one fluorine component selected from $CF_4$ and $CHF_3$. Preferably, the fluorine recipe comprises both $CF_4$ and $CHF_3$. In certain preferred embodiments, the fluorine recipe also comprises an additional fluorine component, such as $SF_6$. Thus, in one embodiment of the present invention, the fluorine recipe comprises at least $CF_4$ or $CHF_3$. In other embodiments, the fluorine recipe comprises either $CF_4$ or $CHF_3$, and $SF_6$. In other embodiments, the fluorine recipe comprises $CF_4$ and $CHF_3$, and may further include $SF_6$.

In addition to the fluorine component(s) present in the etch recipe, as described above, the recipe for etching through the hard mask/barrier layer interface in accordance with the present invention further includes argon gas. Other optional gases which may be introduced into the etch recipe during etch through of the hard mask/barrier layer interface in accordance with the present invention include oxygen and/or nitrogen.

In accordance with various embodiments of the present invention, $CF_4$ can generally be introduced into an etching apparatus at a flow rate of about 10 to about 100 sccm (standard cubic centimeters per minute). Preferably, $CF_4$ is introduced into the apparatus at a flow rate of about 20 to about 50 sccm, and more preferably at a flow rate of about 20 to about 35 sccm. In one particularly preferred embodiment according to the present invention, $CF_4$ is introduced at a flow rate of about 25 sccm.

In accordance with various embodiments of the present invention, $CHF_3$ can generally be introduced into an etching apparatus at a flow rate of about 10 to about 100 sccm. Preferably, $CHF_3$ is introduced into the apparatus at a flow rate of about 20 to about 80 sccm, and more preferably at a flow rate of about 40 to about 80 sccm. In one particularly preferred embodiment according to the present invention, $CHF_3$ is introduced at a flow rate of about 60 sccm.

In accordance with certain embodiments of the present invention, $SF_6$ can optionally be introduced into an etching apparatus at a flow rate of up to about 100 sccm. Preferably, $SF_6$ is introduced into the apparatus at a flow rate of about 5 to about 50 sccm, and more preferably at a flow rate of about 5 to about 20 sccm. In one particularly preferred embodiment according to the present invention, $SF_6$ is introduced at a flow rate of about 10 sccm.

In accordance with certain embodiments of the present invention, oxygen ($O_2$) can optionally be introduced into an etching apparatus at a flow rate of up to about 30 sccm. Preferably, $O_2$ is introduced into the apparatus at a flow rate of up to about 20 sccm, and more preferably at a flow rate of about 5 to about 15 sccm. In one particularly preferred embodiment according to the present invention, $O_2$ is introduced at a flow rate of about 13 sccm.

Argon gas present in the etch recipe in accordance with various embodiments of the present invention can generally be introduced into an etching apparatus at a flow rate of about 100 to about 200 sccm. Preferably, argon is introduced into the apparatus at a flow rate of about 150 to about 200 sccm, and more preferably at a flow rate of about 150 to about 180 sccm. In one particularly preferred embodiment according to the present invention, argon is introduced at a flow rate of about 175 sccm.

While each of the etch recipe parameters, including chamber pressure, source power and gas flow rates can be individually selected from among the general, preferred, more preferred and most preferred embodiments described above, certain particularly preferred embodiments of the present invention can be carried out using the parameters set forth in Table 1.

TABLE 1

| | |
|---|---|
| Chamber pressure (mT) | ~150 |
| Source power @ 13.56 MHz (W) | ~1100 |
| Ar flow (sccm) | ~175 |
| CF$_4$ flow (sccm) | ~25 |
| CHF$_3$ flow (sccm) | ~60 |
| SF$_6$ flow (sccm) | ~10 |
| O$_2$ flow (sccm) | ~13 |

Figure 5:
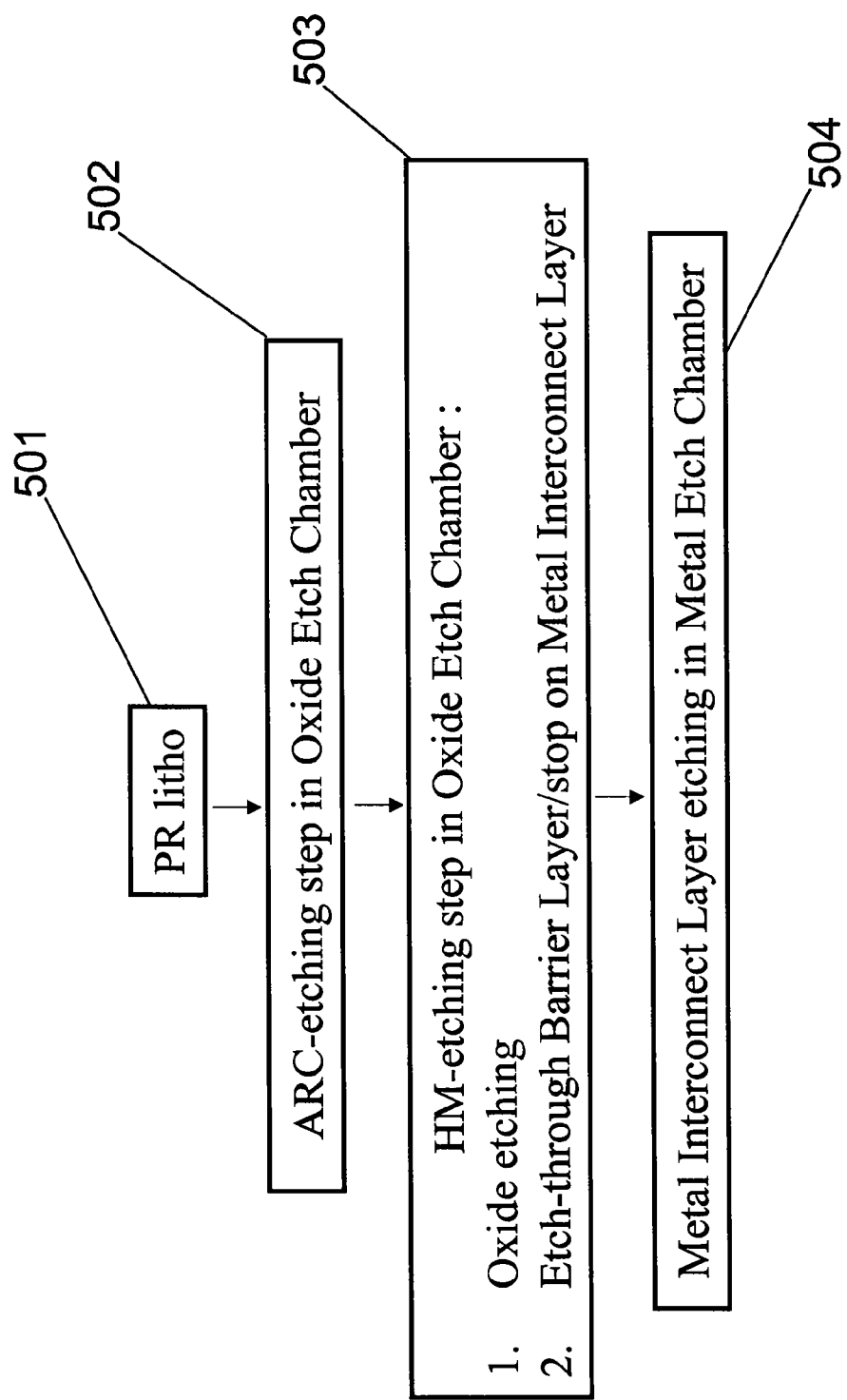
FIG. 5 is a process flow chart depicting a method in accordance with one embodiment of the present invention.

Referring to FIG. 5, one embodiment of a method according to the present invention is depicted by the flow chart shown therein. A method in accordance with the embodiment depicted by the flow chart includes a photoresist lithography process 501, wherein a photoresist layer which serves as the patterning layer and an underlying antireflective coating disposed above a hard mask layer are irradiated through a reticle to print a pattern in the photoresist material. The undeveloped portions of the photoresist layer are removed, such that a pattern is left in the photoresist material. After the pattern is formed in the photoresist layer, etching through the hard mask layer, and at least a portion of the barrier layer can be carried out, as described in accordance with the various embodiments set forth above.

In FIG. 5, following the photolithography, the embodiment of the present invention depicted therein further includes etching 502 of the antireflective coating, which is situated between the photoresist layer and the hard mask layer. The etching 502 of the antireflective coating can be carried via any suitable etching procedure, but can preferably be carried out using the same equipment, recipe and parameters as the hard mask layer etching to follow. After the antireflective coating is etched, the hard mask layer etching can begin using a fluorine-containing etch recipe as described above. The hard mask layer etching 503 includes etching through the hard mask layer/barrier layer interface, and may continue through the barrier layer to stop on the metal interconnect layer. Finally, the metal interconnect layer is etched using the pattern formed in the hard mask layer and barrier layer.

Methods in accordance with the present invention can provide a significantly reduced number of defects after etching of metal interconnect/barrier layer interfaces. As shown below in Table 2, methods in accordance with two embodiments of the present invention (Examples 1-2) exhibit a significantly decreased number of defects in comparison to prior art methods (Comparative Examples 1-3). Examples 1 and 2 show the number of defects observed via an imaging inspection system (Instrument Model KLA 2351, obtained commercially from KLA-Tencor Corporation) when hard mask pattering is carried out through the entire barrier layer or at least a portion thereof, respectively, using an etch recipe in accordance with the parameters set forth above in Table 1.

TABLE 2

| | Hard Mask Material | Technology | HM # of Defects | Metal Etch # of Defects |
|---|---|---|---|---|
| Example 1 | TEOS | HM Patterning through TiN layer | 18 | 31 |
| Example 2 | TEOS | HM Pattering w/partial etch of barrier layer | 26 | 43 |
| Comparative Example 1 | TEOS | SSDARC between HM & TiN, stop etch at SSDARC | 35 | 75 |
| Comparative Example 2 | TEOS | HM etch stop at barrier layer | 25 | 81 |
| Comparative Example 3 | PEOX | HM etch stop at barrier layer | 64 | 93 |

In Table 2 above, "HM # of Defects" refers to the number of defects observed when the wafer was inspected following hard mask patterning. "Metal Etch # of defects" refers to the number of defects observed when the wafer was inspected following metal layer etching.

Comparative Example 1 shows the number of defects observed via the inspection method described above with respect to Examples 1 & 2, when hard mask etching is stopped at a silicon-enriched SiON layer (SSDARC) disposed between the hard mask and the barrier layer. The etch recipe and parameters employed were the same as those set forth in Table 1 except that the etch time was strictly controlled via optical emission spectroscopy (OES) to stop at the SSDARC layer.

Comparative Example 2 shows the number of defects observed via the inspection method described above with respect to Examples 1 & 2, when hard mask etching is stopped at the barrier layer without an SDDARC layer present. The etch recipe and parameters employed were the same as those set forth in Table 1 except that the etch time was strictly controlled via optical emission spectroscopy (OES) to stop at the TiN barrier layer.

Comparative Example 3 shows the number of defects observed via the inspection method described above with respect to Examples 1 & 2, when hard mask etching is stopped at the barrier layer without an SSDARC layer present, and with an alternative hard mask material, PEOX. The etch recipe and parameters employed were the same as those set forth in Table 1 except that the etch time was strictly controlled via optical emission spectroscopy (OES) to stop at the TiN barrier layer.

As can be seen from the righthand-most column of Table 2, etching methods in accordance with Examples 1 and 2 of the present invention exhibit a significantly reduced number of defects after metal layer etching.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method comprising:
   providing a stack to be etched, the stack comprising a metal interconnect layer disposed above a substrate, a barrier layer disposed above the metal interconnect layer, a hard mask layer disposed on the barrier layer, and a patterning layer disposed above the hard mask layer wherein the patterning layer defines a pattern above the hard mask layer;
   etching the pattern through the hard mask layer and at least a portion of the barrier layer, wherein the etching through an interface between the hard mask layer and the barrier layer is carried out using a fluorine-containing etch recipe; and
   etching through remaining portions of the barrier layer and the metal interconnect layer by using an etcher different from the fluorine-containing etch recipe.

2. The method according to claim 1, wherein the metal interconnect layer comprises aluminum.

3. The method according to claim 1, wherein the barrier layer comprises titanium.

4. The method according to claim 1, wherein the barrier layer comprises two or more layers, wherein one of the two or more layers comprises an anti-reflective coating.

5. The method according to claim 4, wherein the anti-reflective coating comprises TiN.

6. The method according to claim 1, wherein the hard mask layer comprises an oxide.

7. The method according to claim 1, wherein the hard mask layer comprises PE-TEOS.

8. The method according to claim 3, wherein the hard mask layer comprises an oxide.

9. The method according to claim 3, wherein the hard mask layer comprises PE-TEOS.

10. The method according to claim 1, wherein the stack further comprises an anti-reflective coating layer between the patterning layer and the hard mask layer.

11. The method according to claim 1, wherein the fluorine-containing etch recipe comprises at least one component selected from $CF_4$ and $CHF_3$.

12. The method according to claim 1, wherein the fluorine-containing etch recipe comprises $CF_4$ and $CHF_3$.

13. The method according to claim 12, wherein the fluorine-containing etch recipe further comprises $SF_6$.

14. The method according to claim 1, wherein the etching is carried out in an etch chamber at a pressure of about 75 to about 200 millitorrs.

15. The method according to claim 1, wherein the etching is carried out in an etch chamber at a source power of about 800 to about 1500 watts.

16. The method according to claim 1, wherein the etching comprises feeding $CF_4$ at a flow rate of about 10 to about 100 sccm and $CHF_3$ at a flow rate of about 10 to about 100 sccm to an etching apparatus.

17. The method according to claim 16, wherein the etching further comprises feeding $SF_6$ at a flow rate of up to about 100 sccm to the etching apparatus.

18. The method according to claim 17, wherein the etching further comprises feeding $O_2$ at a flow rate of up to about 30 sccm to the etching apparatus.

19. A method comprising:
   providing a stack to be etched, the stack comprising a metal interconnect layer disposed above a semiconductor substrate, a titanium-containing barrier layer disposed above the metal interconnect layer, an oxide hard mask layer disposed on the barrier layer, and a photoresist patterning layer disposed above the hard mask layer wherein the patterning layer defines a pattern above the hard mask layer;
   etching the pattern through the hard mask layer and at least a portion of the barrier layer, wherein the etching through an interface between the hard mask layer and the barrier layer is carried out using a fluorine-containing etch recipe; and
   etching through remaining portions of the barrier layer and the metal interconnect layer by using an etcher different from the fluorine-containing etch recipe.

20. The method according to claim 19, wherein the etching comprises feeding $CF_4$ at a flow rate of about 10 to about 100 sccm and $CHF_3$ at a flow rate of about 10 to about 100 sccm to an etching apparatus.

* * * * *